US009725309B2

(12) United States Patent
Gonska et al.

(10) Patent No.: US 9,725,309 B2
(45) Date of Patent: Aug. 8, 2017

(54) MICROMECHANICAL SENSOR DEVICE AND CORRESPONDING MANUFACTURING METHOD

(71) Applicant: Robert Bosch GmbH, Stuttgart (DE)

(72) Inventors: Julian Gonska, Reutlingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/953,936

(22) Filed: Nov. 30, 2015

(65) Prior Publication Data

US 2016/0152466 A1 Jun. 2, 2016

(30) Foreign Application Priority Data

Dec. 1, 2014 (DE) .................. 10 2014 224 559

(51) Int. Cl.
  *B81B 7/00* (2006.01)
  *B81C 1/00* (2006.01)
(52) U.S. Cl.
  CPC ...... *B81C 1/00238* (2013.01); *B81B 2207/07* (2013.01); *B81C 2203/0792* (2013.01)
(58) Field of Classification Search
  CPC ..... B81B 7/00; B81B 7/0048; B81C 1/00238; B81C 1/00325
  See application file for complete search history.

(56) References Cited

U.S. PATENT DOCUMENTS

| 7,250,353 | B2 | 7/2007 | Nasiri et al. |
| 7,442,570 | B2 | 10/2008 | Nasiri et al. |
| 2012/0049299 | A1 | 3/2012 | Chou |
| 2012/0235251 | A1 | 9/2012 | Daneman et al. |
| 2013/0001710 | A1 | 1/2013 | Daneman et al. |
| 2015/0198493 | A1* | 7/2015 | Kaelberer ........... G01P 15/0802 73/718 |

* cited by examiner

*Primary Examiner* — Fazli Erdem
(74) *Attorney, Agent, or Firm* — Norton Rose Fulbright US LLP; Gerard Messina

(57) ABSTRACT

A micromechanical sensor device includes: an ASIC substrate having a first front side and a first rear side; a rewiring element formed on the first front side and including multiple stacked conductor levels and insulating layers; a MEMS substrate having a second front side and a second rear side; a first micromechanical functional layer formed on top of the second front side; and a second micromechanical functional layer formed on top of the first micromechanical functional layer and connected to the rewiring element. In the second micromechanical functional layer, a movable sensor structure is anchored on one side via a first anchoring area, and an electrical connecting element formed in a second anchoring area is anchored on one side on the ASIC, and the first and second anchoring areas are elastically connected to one another via a spring element.

12 Claims, 4 Drawing Sheets

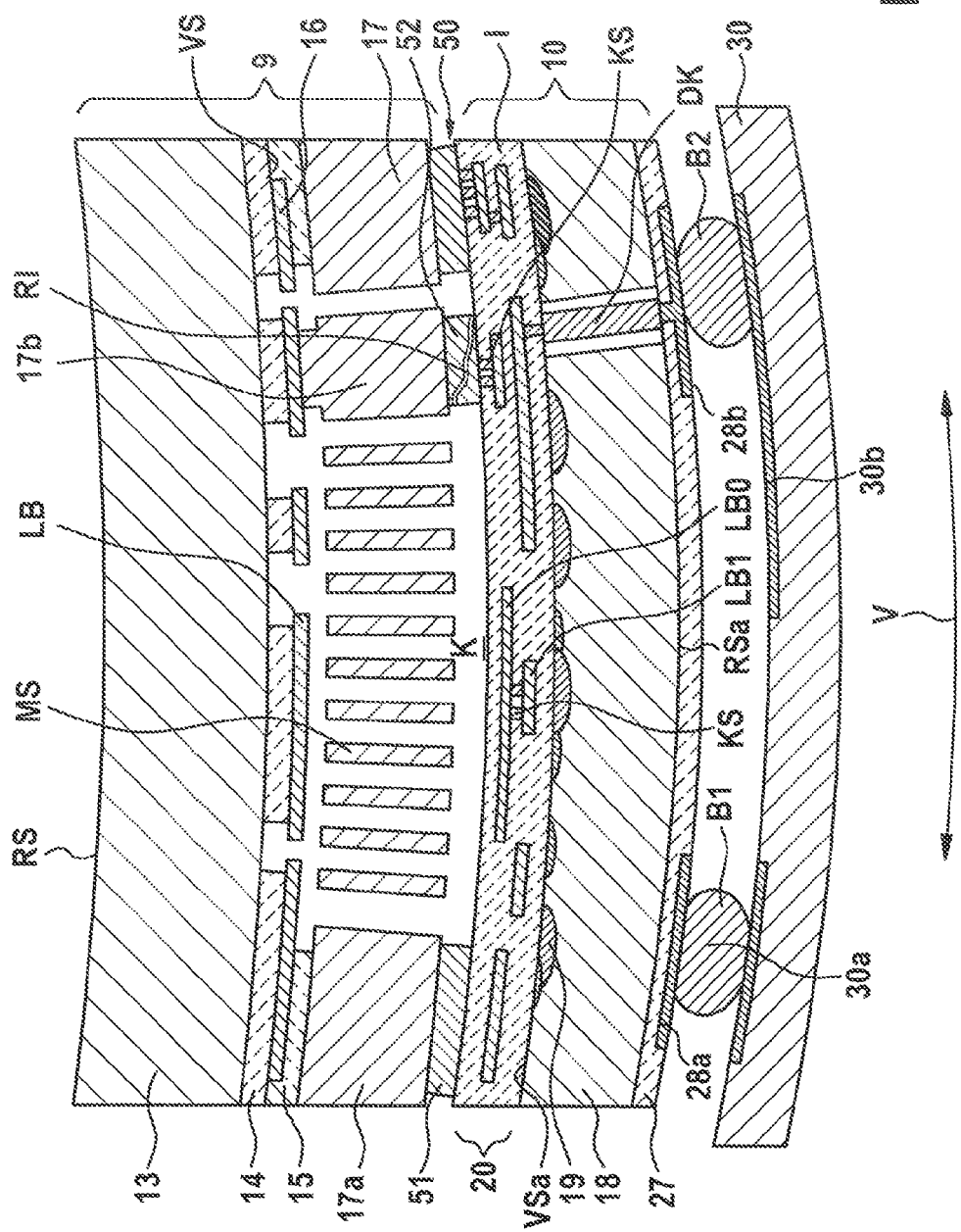

MICROMECHANICAL SENSOR DEVICE AND CORRESPONDING MANUFACTURING METHOD

BACKGROUND OF THE INVENTION

1. Field of the Invention

The present invention relates to a micromechanical sensor device and a corresponding manufacturing method.

2. Description of the Related Art

Although any micromechanical components are applicable, the present invention and its underlying object to be achieved are explained with reference to components which include inertial sensors based on silicon.

Micromechanical sensor devices for measuring acceleration, rotation rate, magnetic field, and pressure, for example, are generally known, and are mass-produced for various applications in the automotive and consumer sectors. In particular the miniaturization of components, functional integration, and effective cost reduction are trends in consumer electronics.

Nowadays, acceleration sensors and rotation rate sensors, as well as acceleration sensors and magnetic field sensors, are already manufactured as combination sensors (6d), and in addition there are first 9d modules, in which in each case 3-axis acceleration sensors, rotation rate sensors, and magnetic field sensors are combined into a single sensor device.

At the present time, mold packages dominate the market for inertial sensors; in mold packages, the silicon chips, for example a MEMS chip and an evaluation ASIC chip, are glued to a shared substrate, connected to one another and to external contacts via wire bonds, and subsequently coated with a plastic compound. So-called chip scale packages are of major importance for the future miniaturization of MEMS sensor devices and MEMS actuator devices. A plastic outer package is completely dispensed with in these components. Instead, the silicon chips are soldered directly to the application circuit boards via flip chip technologies. Such components are sometimes also often referred to as bare die structures. With regard to the footprint and possibly also the installation height, they have advantages over comparable products in mold packages.

One of the great challenges of chip scale packages for MEMS sensor devices is the control of stress effects. Due to the direct flip chip installation of the silicon chips on the application circuit boards, deformations are generally coupled more directly and more strongly into the MEMS chip than in mold packages, in which the introduction of stress is imparted via adhesives and molding compounds, and therefore occurs with alleviation.

Methods of so-called vertical integration, hybrid integration, or 3D integration are known, for example from U.S. Pat. No. 7,250,353 B2 or U.S. Pat. No. 7,442,570 B2, in which at least one MEMS wafer and one evaluation ASIC wafer are mechanically and electrically connected to one another via wafer bonding processes. These vertical integration methods in combination with silicon vias and flip chip technologies are particularly attractive, for which reason the external contacting may take place as a bare die module or a chip scale package, and thus without plastic outer packaging, as known from US Patent Application Publication 2012/0049299 A1 or US Patent Application Publication 2012/0235251 A1, for example.

US Patent Application Publication 2013/0001710 A1 provides a method and a system for forming a MEMS sensor device, in which a handling wafer is bonded to a MEMS wafer via a dielectric layer. After structuring the MEMS wafer to form the micromechanical sensor device, a CMOS wafer is bonded to the MEMS wafer, which includes the sensor device. At the end of the process, the handling wafer may be further processed by etching or back-grinding, if necessary.

FIG. 4 shows a schematic cross-sectional view for explaining the object to be achieved in an example of a micromechanical sensor device.

In FIG. 4, reference numeral 9 denotes a MEMS substrate, for example a chip substrate, which includes a silicon base substrate 13, a first insulating layer 14 which is applied thereto and structured, a first micromechanical functional layer 16 which is applied thereto and structured, and a second insulating layer 15 which is applied on top and structured. A second micromechanical functional layer 17 is deposited on top of second insulating layer 15 and structured. Insulating layers 14, 15 are made of silicon dioxide, for example, whereas first and second micromechanical functional layers 16, 17 are made of polysilicon. In this example, first, thinner micromechanical functional layer 16 made of polysilicon is used primarily as a conductor level including conductor sections LB, while movable micromechanical sensor structures MS for acceleration sensors, rotation rate sensors, or magnetic sensors, for example, are formed in second, thicker micromechanical functional layer 17.

Sensor structure MS, illustrated as an example, is connected to second insulating layer 15 or to first micromechanical functional layer 16 via rigid anchoring areas 17a, 17b.

MEMS substrate 9 may contain additional micromechanical functional layers and insulating layers. The micromechanical functional layers may also be applied by wafer bonding processes and subsequent back-grinding.

Reference numeral 10 denotes an ASIC substrate having a front side VSa and a rear side RSa, for example likewise a chip substrate, which is preferably manufactured in a CMOS process. The ASIC substrate is made up of a base silicon substrate 18, doped semiconductor layers 19 for implementing integrated electrical circuits, and a rewiring element 20 which is formed on front side VSa of ASIC substrate 10 and which includes a plurality of stacked conductor levels LB1, LB0, contact plugs KS for electrically connecting conductor levels LB0, LB1 and for external electrical connection, and a plurality of insulating layers I which electrically insulate the conductor levels and their surroundings.

A via DK connects front side VSa of ASIC substrate 10 to its rear side RSa. An additional insulating layer 27 is deposited on rear side RSa, and includes rewiring lines 28a, 28b embedded therein which are used for electrical contacting. This electrical contacting and mechanical attachment to a carrier substrate 30 takes place with the aid of solder balls B1, B2. Carrier substrate 30 likewise includes conductors 30a, 30b for the electrical connection.

MEMS substrate 9 and ASIC substrate 10 are joined together via a metallic bonding process, for example a wafer bonding process, for example via eutectic bonding of aluminum with germanium. An uppermost aluminum conductor level is utilized as a bond surface on ASIC substrate 10, for example, and germanium is deposited on second micromechanical functional layer 17 of MEMS substrate 9 as the uppermost layer. The two substrates are then pressed together at temperatures above 430° C. with sufficient pressure so that a eutectic liquid phase results. Bond connection 50 made of AlGe (aluminum-germanium) on the one hand effectuates hermetic encapsulation of movable sensor structure MS in a cavity K with the aid of a circumferential bond frame 51, and on the other hand makes it possible for anchoring area 17b of second micromechanical functional layer 17 to have an electrical contact area 52 to ASIC substrate 10. Other metallic bonding processes, for example copper-tin bonding or thermocompression bonding, are likewise conceivable in principle.

To establish a stable mechanical connection between MEMS substrate 9 and ASIC substrate 10, a relatively wide circumferential bond frame 51 is usually implemented. Movable sensor structure MS is situated preferably symmetrically within this bond frame 51 in order to compensate for external stress effects.

Electrical contact areas 52 formed from bond connection 50 are usually implemented in the interior as very small contacts. Since a very large number of contacts are required, it is not possible to provide these contacts with a very large, and thus mechanically stable, design.

Electrical contact areas 52 may be placed either very close to bond frame 51 or in the middle of the chip. In a location close to the bond frame, the electrical contact areas are mechanically supported during the bonding process due to their immediate proximity to wide bond frame 51. However, in the separation process, usually a sawing process, contact areas 52 are very close to the cutting line, and experience vibrations which may emanate from that location and damage contact areas 52.

In the middle of the chip, contact areas 52 experience high mechanical stress during the bonding process, and may be damaged. During use, high mechanical stress on contacts 52 may also result at that location when, as in the present example, the component is soldered to a carrier substrate 30, which may transmit stress effects to the component.

In FIG. 4, this type of bending stress V results in cracks RI in electrical contacts 52. Such bending stress may be caused by the stress on the circuit board when the circuit board is pressed into a terminal device, or due to differing thermal coefficients of expansion. In addition to the damage to contact areas 52, contact areas 52 also always cause an asymmetrical mechanical deformation between MEMS substrate 9 and ASIC substrate 10 within bond frame 51. The MEMS substrate is therefore very sensitive to external stress, which reduces the service life.

BRIEF SUMMARY OF THE INVENTION

The present invention provides a micromechanical sensor device which includes a MEMS substrate having a movable sensor structure, and an ASIC substrate connected thereto which may be utilized for evaluation purposes. The sensor device according to the present invention contains a robust mechanical or electrical contact connection between the MEMS substrate and the ASIC substrate, which at the same time reduces the stress sensitivity of the component. The sensor device is compatible with presently customary manufacturing processes, and may also be combined with additional measures for reducing the stress sensitivity.

The concept underlying the present invention is that an electrical connecting element formed in an anchoring area of the micromechanical functional layer containing the sensor structure is elastically coupled via a spring element to a further anchoring area in the micromechanical functional layer containing the sensor structure.

Due to the one-sided elastic suspension in each case, mechanical overstraining of the associated contact area is avoided. Much smaller contact areas may be implemented. The contact areas are freely placeable within the component.

Due to the elastic suspension, the contact areas do not cause transmission of stress to the MEMS substrate.

According to one preferred refinement, a further electrical contact element is formed in the first anchoring area. The further electrical contact element may conduct electrical signals of the first micromechanical functional layer.

According to another preferred refinement, the second anchoring area is electrically connected to the rewiring element via the contact area. A signal entry into the ASIC chip may be easily implemented in this way.

According to another preferred refinement, the second anchoring area is connected to the rewiring element via an electrically insulating spacer area. A capacitor plate may thus be formed and suitably anchored in the second micromechanical functional layer.

According to another preferred refinement, the electrical contact element has a perforation. This increases the effectiveness during an undercut step.

According to another preferred refinement, the electrical contact element together with a conductor area formed in the first micromechanical functional layer forms a measuring capacitor structure. Changes in stress may thus be measured.

According to another preferred refinement, the electrical contact element together with a conductor area formed in the first micromechanical functional layer forms a short circuit test structure. Errors during the bonding operation may be ascertained in this way.

According to another preferred refinement, a cavity is formed between the first front side and the second front side, the first anchoring area and the second anchoring area each being delimited by the cavity on their unanchored side. Space for the unconnected side of the anchoring areas may thus be provided.

According to another preferred refinement, the bond connection includes a circumferential bond frame area. The sensor structure may be capped in this way.

According to another preferred refinement, the spring element is under pretensioning with respect to the first front side. This improves the bond reliability in particular for small contact areas.

BRIEF DESCRIPTION OF THE DRAWINGS

FIG. 4 shows a schematic cross-sectional view for explaining the object to be achieved in an example of a micromechanical sensor device.

DETAILED DESCRIPTION OF THE INVENTION

Figure 1:
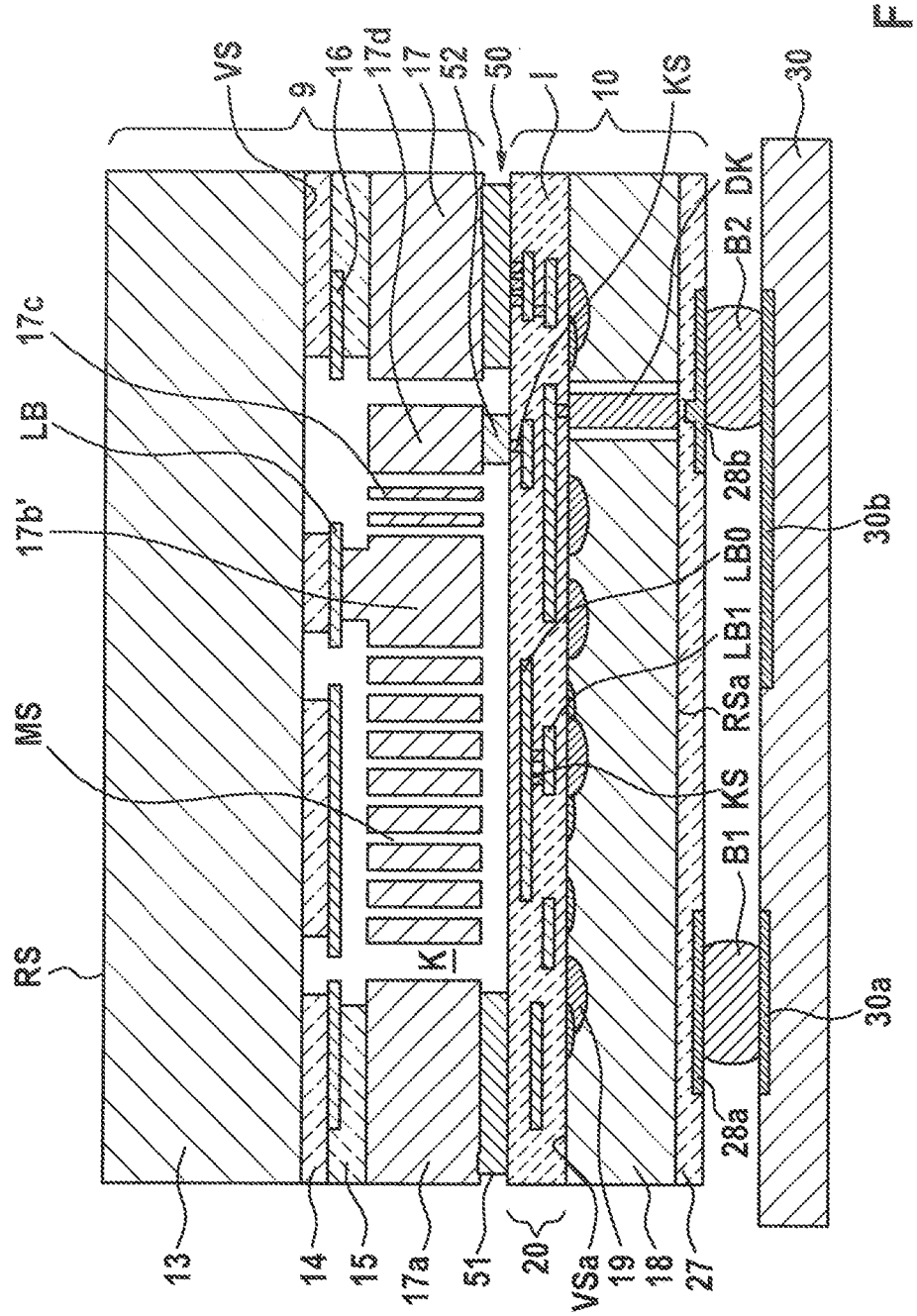
FIG. 1 shows a schematic cross-sectional view for explaining a micromechanical sensor device according to a first specific embodiment of the present invention.

Identical or functionally equivalent elements are denoted by the same reference numerals in the figures.

FIG. 1 shows a schematic cross-sectional view for explaining a micromechanical sensor device according to a first specific embodiment of the present invention.

The first specific embodiment of the micromechanical sensor device according to the present invention illustrated in FIG. 1 differs from the example of the sensor device according to FIG. 4 in the configuration and coupling of second micromechanical functional layer 17.

According to FIG. 1, micromechanical functional layer 17, the same as that according to FIG. 4, includes a rigid anchoring area 17a at the edge which is connected to movable sensor structure MS. Also provided is a first anchoring area 17b' which is formed in second micromechanical functional layer 17 and which on one side is anchored on a conductor area LB on first micromechanical functional layer 16 of MEMS substrate 9.

An electrical connecting element is formed in a second anchoring area 17d, and is anchored on rewiring element 20 of ASIC substrate 10 and electrically connected via a contact area 52 of bond connection 50. At this location, electrical signals may be led into ASIC substrate 10 via contact plugs KS and stacked conductor levels LB0, LB1 of sensor structure MS of MEMS substrate 9. Second anchoring area 17d is also anchored on only one side.

Due to cavity K, first anchoring area 17b' and second anchoring area 17d each have sufficient free spacing. A spring element 17c formed in second micromechanical functional layer 17 elastically connects first anchoring area 17b' and second anchoring area 17d to one another. The two elastic anchoring areas 17b', 17d are situated within circumferential bond frame 51 of bond connection 50.

Enlarged cavities or other structures which locally increase the undercutting in these areas may be inserted below anchoring areas 17b', 17d during the manufacturing process in order to be able to suitably adapt the surface area of contact areas 52.

Otherwise, the first specific embodiment according to FIG. 1 has an identical design to the example of the sensor device according to FIG. 4 explained above.

Figure 2:
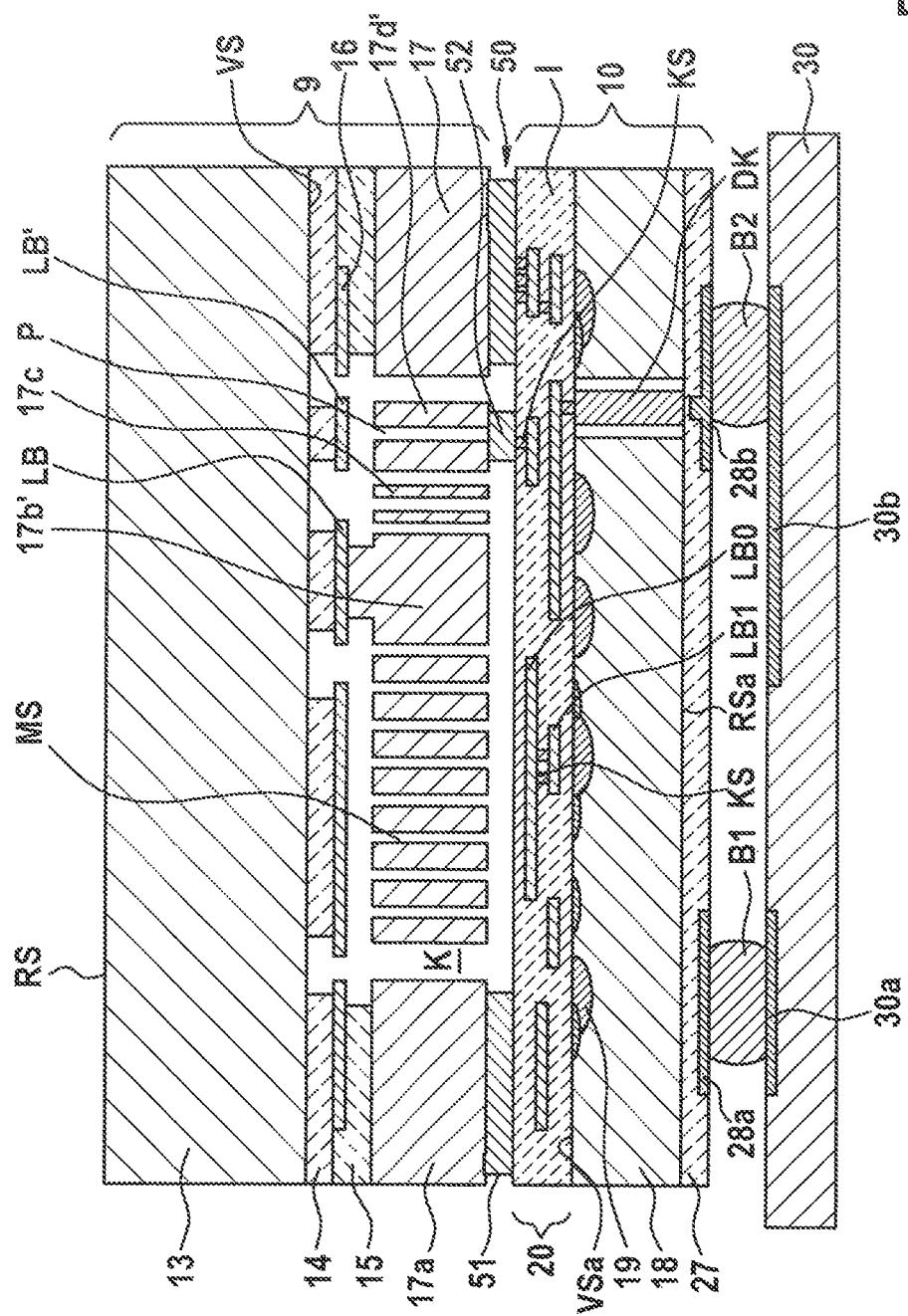
FIG. 2 shows a schematic cross-sectional view for explaining a micromechanical sensor device according to a second specific embodiment of the present invention.

FIG. 2 shows a schematic cross-sectional view for explaining a micromechanical sensor device according to a second specific embodiment of the present invention.

In the second specific embodiment according to FIG. 2, a perforation is provided within second anchoring area 17d' above contact area 52 to be able to suitably undercut contact area 52. The size of perforation P, in particular for a eutectic AlGe bond connection 50, is selected to be narrow enough that, on account of the surface tension, bond material is not able to penetrate into perforation P. It has proven to be particularly advantageous to select perforation P to be narrower than 4 µm (microns).

In addition, in the second specific embodiment an additional conductor section LB' is provided in first micromechanical functional layer 16, above second anchoring area 17d'. Together with second anchoring area 17d', a short circuit test structure may thus be formed.

With this short circuit test structure, with an electrical measurement for short circuits it is possible to test whether eutectic bond connection 50 is running through perforation P or beyond the edge of contact area 52, and whether it makes mechanical and electrical contact with MEMS substrate 9. This type of short circuit test structure may advantageously be provided at least at a supercritical contact area 52 in order to safeguard the functioning and reliability for each individual component. In the present context, "supercritical contact area 52" means either a contact area which has a slightly larger perforation P, for example larger than 5 µm, or a contact area 52 which has a slightly larger surface area, i.e., which locally includes slightly more eutectic bond material and therefore has a more likely tendency to flow.

In addition, it may prove advantageous to design elastic second anchoring area 17d', including contact area 52, in such a way that it comes into mechanical contact slightly earlier than solid bond frame 51 during the bonding process, and via spring element 17c is thus always under slight pressure or pretensioning, resulting in a very reliable bond connection in contact area 52.

Due to this pretensioning and the elastic suspension via spring element 17c, high reliability of contact area 52 may be achieved, even under high external mechanical stress. The mechanical pretensioning may be achieved by a layer (not illustrated) which is provided either on ASIC substrate 10 or on MEMS substrate 9 in the contact area. Alternatively, spring element 17c may be provided in such a way that it is predeflected. As second micromechanical functional layer 17, for example an epitaxially grown polysilicon layer may be used which for this purpose is set by the growth conditions, the doping, and the thermal post-treatment in such a way that the second micromechanical functional layer has a stress gradient, and spring element 17c therefore bends away slightly from MEMS substrate 9.

Figure 3:
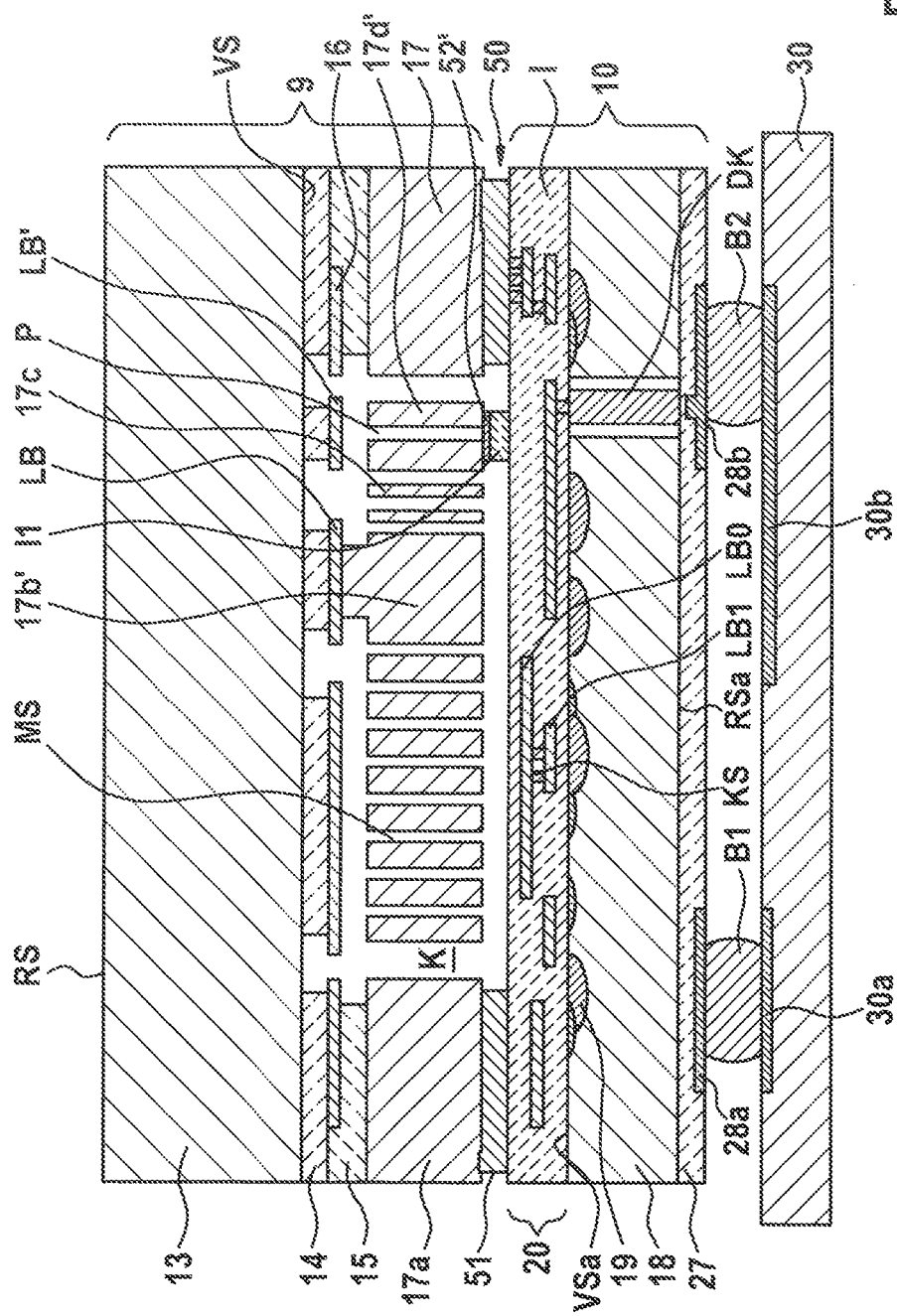
FIG. 3 shows a schematic cross-sectional view for explaining a micromechanical sensor device according to a third specific embodiment of the present invention.

FIG. 3 shows a schematic cross-sectional view for explaining a micromechanical sensor device according to a third specific embodiment of the present invention.

In the third specific embodiment, a spacer I1 is provided below contact area 52' of bond connection 50, beneath perforated second anchoring area 17d''. Spacer I1 is integrated into bond connection 50, so that the bond material as well as the material of spacer I1 is present at this location.

Second anchoring area 17d'' together with perforation P and conductor section LB' of first micromechanical functional layer 16 thus form a measuring capacitor structure. Via the capacitance of the capacitor structure formed in this way, a change in distance d between second anchoring area 17d'' and conductor section LB' may be measured, which may be useful during production as well as during subsequent use.

During the bonding, bond frame 51 is soft and squeezed. Using conventional methods such as infrared microscopy, for example, after the bonding it is very difficult to measure whether the bonding was successful, i.e., whether the components are fixedly joined together all over the wafer. With the aid of such a capacitance measurement of the measuring capacitor structure, it may be easily measured whether a deflection of spring element 17c, and thus squeezing, has taken place. In field operation, the deformation may be continuously monitored with the aid of the measuring capacitor structure, which greatly improves the system performance.

Although the present invention has been described with reference to preferred exemplary embodiments, it is not limited thereto. In particular, the mentioned materials and topologies are solely examples, and are not limited to the described examples.

What is claimed is:

1. A micromechanical sensor device, comprising:
   an ASIC substrate having a first front side and a first rear side;
   a rewiring element formed on the first front side and including multiple stacked conductor levels and insulating layers;
   a MEMS substrate having a second front side and a second rear side;
   a first micromechanical functional layer formed on top of the second front side;
   a second micromechanical functional layer formed on top of the first micromechanical functional layer and connected to the rewiring element via a bond connection;
   a movable sensor structure formed in the second micromechanical functional layer and anchored on one side on the MEMS substrate via a first anchoring area formed in the second micromechanical functional layer;
an electrical connecting element which is formed in a second anchoring area of the second micromechanical functional layer and anchored on one side of the ASIC substrate via a contact area of the bond connection; and
a spring element formed in the second micromechanical functional layer and elastically connecting the first anchoring area and the second anchoring area to one another.

2. The micromechanical sensor device as recited in claim 1, wherein a further electrical contact element is formed in the first anchoring area.

3. The micromechanical sensor device as recited in claim 1, wherein the second anchoring area is electrically connected to the rewiring element via the contact area of the bond connection.

4. The micromechanical sensor device as recited in claim 1, wherein the second anchoring area is electrically connected to the rewiring element via an electrically insulating spacer area.

5. The micromechanical sensor device as recited in claim 1, wherein the electrical contact element has a perforation.

6. The micromechanical sensor device as recited in claim 4, wherein the electrical contact element and a conductor area formed in the first micromechanical functional layer together form a measuring capacitor structure.

7. The micromechanical sensor device as recited in claim 3, wherein the electrical contact element and a conductor area formed in the first micromechanical functional layer together form a short circuit test structure.

8. The micromechanical sensor device as recited in claim 1, wherein a cavity is formed between the first front side and the second front side, and wherein the first anchoring area and the second anchoring area are each delimited by the cavity on a respective unanchored side.

9. The micromechanical sensor device as recited in claim 8, wherein the bond connection includes a circumferential bond frame area.

10. The micromechanical sensor device as recited in claim 8, wherein the spring element is under pretensioning with respect to the first front side.

11. A manufacturing method for a micromechanical sensor device, comprising:
providing an ASIC substrate having a first front side and a first rear side;
forming a rewiring element which includes multiple stacked conductor levels and insulating layers on the first front side of the ASIC substrate;
providing a MEMS substrate having a second front side and a second rear side;
forming a first micromechanical functional layer on top of the second front side;
forming a second micromechanical functional layer on top of the first micromechanical functional layer;
forming a movable sensor structure in the second micromechanical functional layer and anchoring the movable sensor structure on one side on the MEMS substrate via a first anchoring area formed in the second micromechanical functional layer;
forming an electrical connecting element in a second anchoring area in the second micromechanical functional layer;
forming a spring element in the second micromechanical functional layer, wherein the spring element elastically connects the first anchoring area and the second anchoring area to one another; and
connecting the second micromechanical functional layer to the rewiring element via a bond connection, the second anchoring area being anchored on one side of the ASIC substrate via a contact area of the bond connection.

12. The manufacturing method as recited in claim 11, wherein a cavity is formed between the first front side and the second front side during the connection, so that the first anchoring area and the second anchoring area are each delimited by the cavity on a respective unanchored side.

* * * * *